United States Patent [19]

Nishikawa et al.

[11] Patent Number: 5,035,202
[45] Date of Patent: Jul. 30, 1991

[54] FREQUENCY FINE-ADJUSTING APPARATUS FOR A PIEZO-ELECTRIC OSCILLATOR

[75] Inventors: Yukio Nishikawa, Ikeda; Yuji Uesugi, Osaka, both of Japan

[73] Assignee: Matsushita Electric Industrial Co., Ltd., Osaka, Japan

[21] Appl. No.: 507,564

[22] Filed: Apr. 11, 1990

[30] Foreign Application Priority Data

Apr. 13, 1989 [JP] Japan ................................. 1-93531

[51] Int. Cl.⁵ ............................................ C23C 16/00
[52] U.S. Cl. .................................... 118/727; 118/718; 118/724
[58] Field of Search ............................. 427/53.1, 100; 118/50.1, 718, 720, 722, 724, 726, 727

[56] References Cited

U.S. PATENT DOCUMENTS

| | | | |
|---|---|---|---|
| 3,028,262 | 4/1962 | Klingsporn | 427/100 X |
| 3,912,830 | 10/1975 | Murayama et al. | 427/100 |
| 4,340,654 | 7/1982 | Campi | 427/53.1 X |
| 4,631,197 | 12/1986 | DeFreese et al. | 427/53.1 X |
| 4,664,769 | 5/1987 | Cuomo et al. | 204/192.1 |
| 4,752,455 | 6/1988 | Mayer | 427/53.1 |
| 4,767,931 | 8/1988 | Sato et al. | 204/298.04 X |

OTHER PUBLICATIONS von Gutfeld, "Enhancing ... Printing", IBM Tech. Dis. Bulletin, vol. 17, No. 6, 11/74, pp. 1807-1808.

Primary Examiner—Nam X. Nguyen
Attorney, Agent, or Firm—Wenderoth, Lind & Ponack

[57] ABSTRACT

Piezo-electric oscillators are widely used in reference clocks for various apparatus. Prior to use, the oscillation frequency of the piezo-electric oscillators is generally finely adjusted. For this purpose, a frequency fine-adjusting apparatus includes a laser beam generator for emitting a laser beam having a wavelength of 2 μm or less, a target material having a metallic layer, a set of rollers for feeding the target material in the condition in which the metallic layer confronts the main electrode of the piezo-electric oscillator and is spaced a predetermined length from the main electrode, and an optical system for applying the laser beam to the metallic layer. When the laser beam is applied to the metallic layer, part of the metallic layer is vaporized and adheres to the surface of the main electrode, thereby finely adjusting an oscillation frequency of the piezo-electric oscillator.

6 Claims, 3 Drawing Sheets

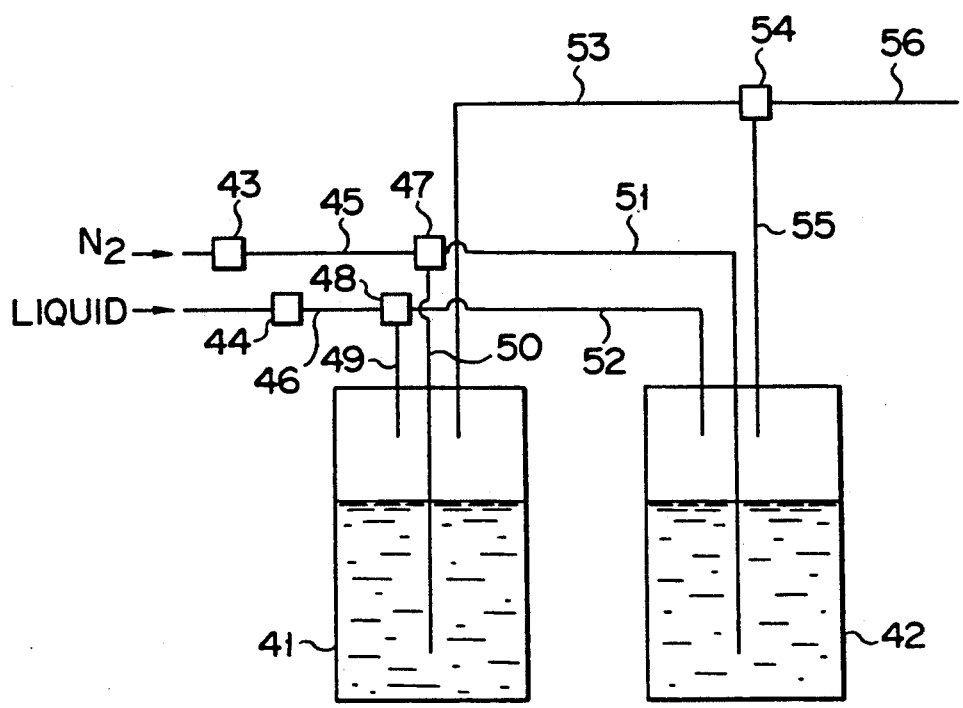
F I G. 2
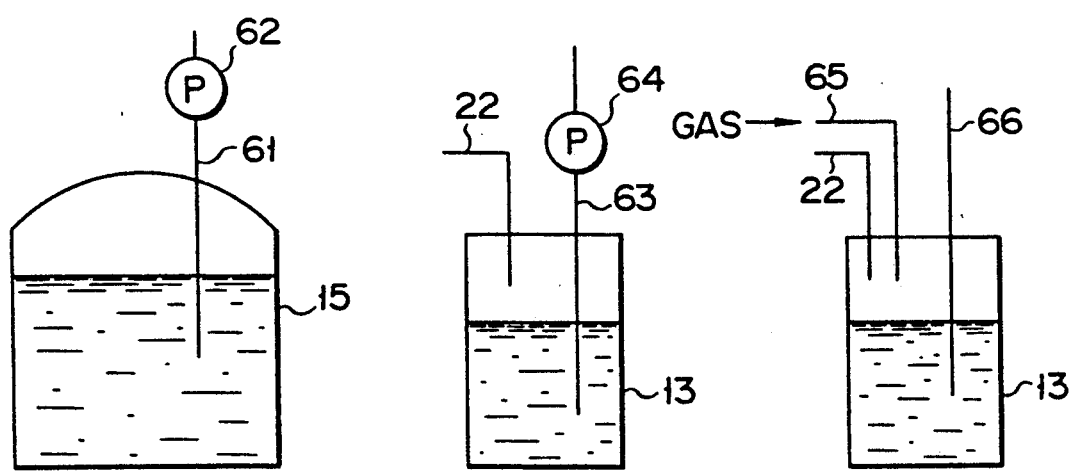
F I G. 3    F I G. 4    F I G. 5

PROCESSING LIQUID SUPPLY UNIT

This application is a Continuation-In-Part of application Ser. No. 360,545, filed on June 2, 1989, now abandoned.

BACKGROUND OF THE INVENTION

1. Field of the Invention

This invention relates to a processing liquid supply unit for supplying a processing liquid used in processes such as adhesion in the manufacturing of semiconductor devices, for example.

2. Description of the Related Art

In a process in which desired processing is performed using a processing liquid, for example, the adhesion process for promoting adhesion between a wafer and a photoresist in the manufacture of semiconductor devices, a processing liquid is supplied to semiconductor wafers set in the processing apparatus in semiconductor manufacturing equipment in a clean room.

Conventionally, such a processing liquid is stored in a storage tank provided inside or adjacent to semiconductor manufacturing equipment and is supplied from the storage tank to semiconductor wafers. An alarm is provided which is arranged such that it is activated when the stored amount of the processing liquid in the tank is consumed by processing of the wafers and decreases below a specified amount. On being notified of the activation of the alarm, the operator enters the clean room and changes tanks. Further, he performs preliminary operations such as refilling the replaced storage tank with a specified gas.

However, the tank changing operation requires a long period of time. When the operator changes storage tanks, the downtime of the semiconductor manufacturing equipment is long. This is not desirable from the viewpoint of keeping the cleanliness of the clean room; for when the operator enters the clean room, he brings dust in. Also, he may be endangered since some kinds of processing liquids are harmful to the human body.

SUMMARY OF THE INVENTION

This invention has been made to overcome this conventional disadvantage and has as its object to provide a processing liquid supply unit which is capable of automatic execution of refilling of a processing liquid and preliminary operations and which reduces a downtime of manufacturing equipment and which is clean and fairly safe.

According to this invention, there is provided a processing liquid supply unit for supplying an object being processed with a processing liquid, comprising storing means for storing a processing liquid, detecting means for detecting the amount of processing liquid stored in the storage means, refilling means for automatically refilling the storing means with a processing liquid on the basis of detection by the detecting means and delivery means for delivering the processing liquid from the storing means to the object being processed.

BRIEF DESCRIPTION OF THE DRAWINGS

FIG. 2 is a diagram showing a piping system used to an embodiment of the present invention when two processing liquid tanks are provided;

FIG. 3 is a diagram showing another example of the mechanism for delivery of a processing liquid from a reserve tank; and FIGS. 4 and 5 are diagrams showing other examples of the mechanism for supplying a processing liquid from a processing liquid tank to the processing section, respectively.

DETAILED DESCRIPTION OF THE PREFERRED EMBODIMENT

Figure 1:
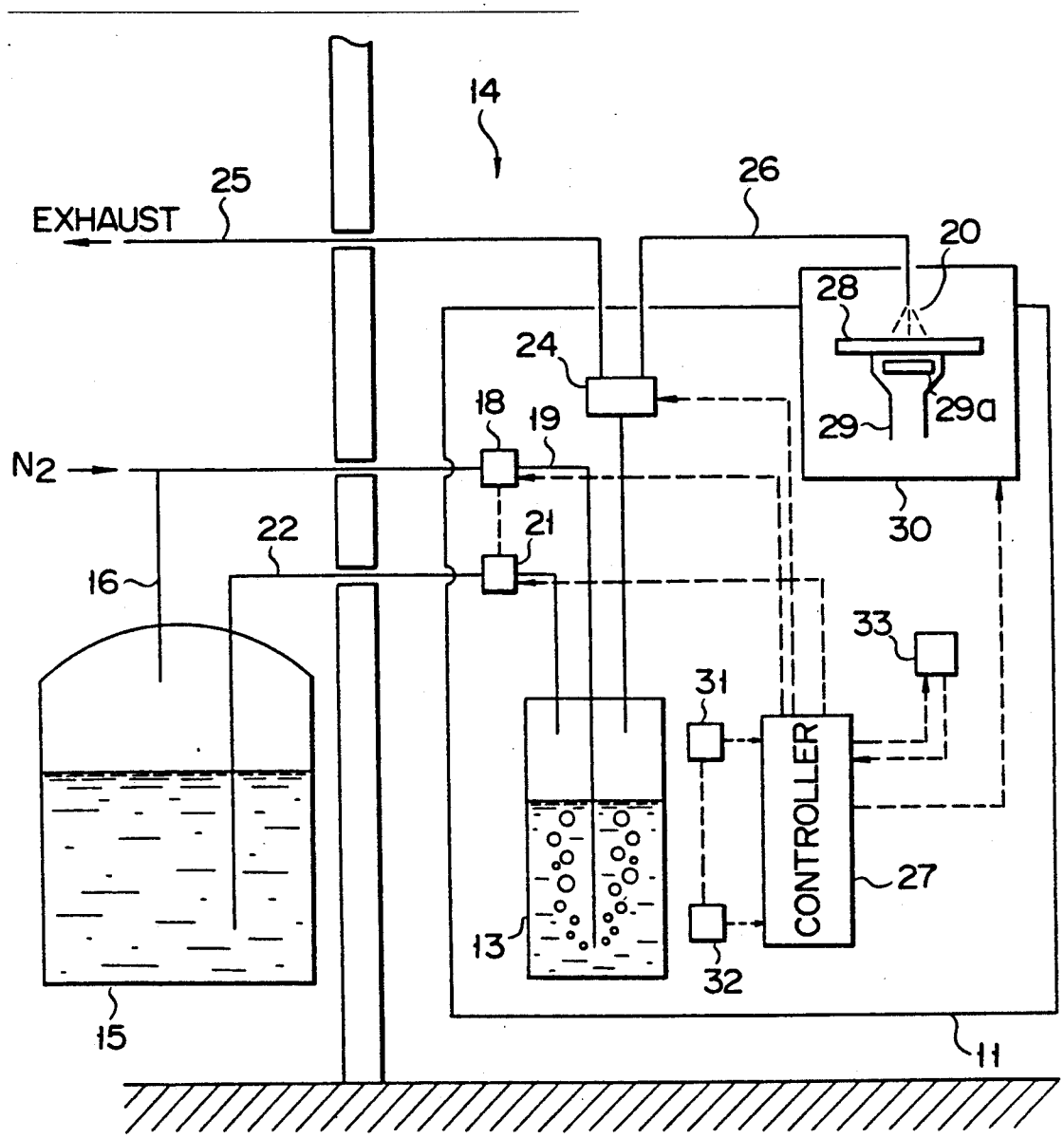
FIG. 1 is a schematic block diagram of apparatus to which the processing liquid supply unit according to this invention is used.

With reference to the accompanying drawings, description will now be made of an embodiment of the present invention, in which this invention is applied to an adhesion processing apparatus in the fabrication of semiconductor devices.

FIG. 1 is a schematic block diagram showing an adhesion processing apparatus to which the processing liquid supply unit according to an embodiment of this invention is applied.

Body 11 of an adhesion processing apparatus installed in a clean room 14, has provided therein tank 13 made of a transparent glass, for example, and containing a processing liquid, HMDS [hexa methyl disilazane $(CH_3)_3SiNHSi(CH_3)_3$], for example.

Reserve tank 15 for refilling HMDS to tank 13 is provided outside clean room 14. In this reserve tank 15, HMDS is stored. When the stored amount in tank 13 drops below the specified amount, HMDS is supplied from reserve tank 15 to tank 13. Additional HMDS is supplied from a processing liquid supply source (not shown) to reserve tank 15 as occasion demands.

Nitrogen, for example, is supplied to reserve tank 15 through gas supply pipe 16, provided above reserve tank 15 and extending from a gas supply source (not shown).

Tank 13 has connected thereto gas supply pipe 19 extending from the above-mentioned gas supply source. Through this pipe 19, nitrogen gas is supplied also to tank 13. Pipe 19 is inserted into tank 13 from above and extends close to the bottom of tank 13. Gas supply valve 18 is provided in gas supply pipe 19 and between the gas supply source and tank 13. With valve 18 open, nitrogen gas supplied from the gas supply source through pipe 19 is blown into the HMDS stored in tank 13, whereby nitrogen gas bubbles 20 are produced and the vapor of HMDS is dissolved in bubbles 20.

Reserve tank 15 and tank 13 are connected by pipe 22. Valve 21 is connected in pipe 22. One end of pipe 22 is located near the bottom of reserve tank 15 and the other end is located at the upper position of tank 13. With valve 22 open, HMDS is supplied, by the nitrogen gas pressure in reserve tank 15, from reserve tank 15 through pipe 22 into tank 13.

Tank 13 has inserted thereinto from above pipe 23 for transporting the vapor of HMDS dissolved in nitrogen gas bubbles 20 from tank 13 to the outside. Pipe 23 is extended at one end to the upper position of tank 13 and connected at the other end to change-over valve 24. Change-over valve 24 has processing liquid supply pipe 26 and exhaust pipe 25 connected thereto. The nitrogen gas having HMDS mixed therein is passed through pipe 23 and is guided by the operation of change-over valve 24 into either exhaust pipe 25 or processing liquid supply pipe 26. The change-over valve 24 is operated by means of signals from controller 27 provided in body 11.

Processing liquid supply pipe 26 is led from above into processing section 30 including wafer chuck 29 for holding a semiconductor wafer by vacuum chucking. With wafer 28 held on wafer chuck 29, the HMDS carried by nitrogen gas is supplied through pipe 26 to wafer 28 for adhesion process. Chuck 29 incorporates heater 29a by which wafer 28 is heated as necessity requires. Upper-limit sensor 31 and lower-limit sensor 32 are provided outside tank 13 and near the upper and lower ends thereof, respectively. Signals from these sensors 31 and 32 are output to controller 27. Sensors 31 and 32 which are of a static capacity type for example, each sense that the level of the HMDS has passed their installed positions. Sensors 31 and 32 may be of a photoelectric type or electromagnetic type. The detection signals are output to controller 27 and according to the output signals, valves 18 and 21 are controlled in their opening/closing motion. More specifically, when a level detection signal is output from lower-limit sensor 32, valve 21 is opened to supply HMDS from reserve tank 15 to tank 13. When a signal is output from upper-limit sensor, valve 21 is closed to stop the supply of HMDS from reserve tank 15 to tank 13 and gas supply valve 18 is opened to introduce nitrogen gas into the HMDS in tank 13, thereby starting gas bubbling. When lower-limit sensor 32 is operated as described, a processing stop signal is output from controller 27 to processing section 30.

Controller 27 has connected thereto timer 33 for setting a nitrogen gas bubbling time according to the capacity of tank 13. To be more specific, controller 27 outputs a signal of bubbling time so that the gas pressure and concentration in tank 13 comes to a specified value on the basis of the capacity of the tank and the timer 33 is thereby set at that time. At the end of the timing period, timer 33 issues a signal, according to which controller 27 causes valve 18 to close and issues a processing start signal to processing section 30. Also, controller 27 controls change-over valve 24 so that change-over valve 24 is connected to the exhaust side when valve 18 is opened or change-over valve 24 is connected to processing section 30 when valve 18 is closed.

It ought to be noted that controller 27 is operated by CPU, not shown, according to a preset procedure.

The unit arranged as described is operated as follows. The initial state of the unit is the state in which the level of the HMDS in tank 13 is located between the detecting positions of sensors 31 and 32.

Semiconductor wafer 28 which is to undergo the adhesion process is brought into processing section 30 by a transfer system (not shown) which uses a transfer arm and vacuum-chucked at the specified position of wafer chuck 29.

Controller 27 under control of the CPU causes change-over valve 24 to be connected to processing section 30. The mixed gas of nitrogen and HMDS, produced by nitrogen bubbling in tank 13, is passed through pipe 23, valve 24 and pipe 26, and supplied in vapor form to wafer 28 from the end of pipe 26 for a specified time. Thus, HMDS is applied to the surface of wafer 28. By coating with HMDS, moisture is prevented from adhering to the surface of wafer 28, thereby improving adhesion between a photoresist and a wafer in the subsequent photoresist coating process.

When a wafer is coated with HMDS, heater 29a is used to heat the wafer when necessary.

As the adhesion promotion process is repeated, the HMDS in tank 13 is consumed and the stored amount of HMDS in tank 13 decreases. When the amount of HMDS decreases and its surface level passes the set position of sensor 32, a detection signal is output to controller 27 and also to the CPU. If wafer 28 is being processed in processing section 30, when this processing has been finished or if processing of wafer 28 is not under way, when a detection signal is given by sensor 32, the CPU issues a processing stop command and controller 27 outputs a processing stop signal to the processing section, whereby the adhesion process is stopped temporarily.

Then, liquid supply valve 21 is opened and the processing liquid, HMDS is automatically supplied from reserve tank 15 into tank 13. For this purpose, change-over valve 24 is connected to the exhaust side to allow the gas in tank 13 to be drawn off and tank 13 can thereby be refilled with HMDS smoothly.

As tank 13 is refilled with HMDS, the liquid level rises in tank 13 and eventually passes through the set position of sensor 31. As sensor 31 senses the rise of the liquid level, it issues a detection signal to controller 27. Controller 27 causes liquid supply valve 21 to close by which refilling is stopped. Controller 27 causes change-over valve 24 to close and the exhaust of the gas from tank 13 is thereby stopped.

In response to a command from the CPU, controller 27 causes gas supply valve 18 to open and nitrogen gas is passed through pipe 19 and introduced into the HMDS in tank 13 for bubbling, whereby bubbles 20 are produced in the HMDS. As bubbles 20 rise through the HMDS in tank 13, the vapor of HMDS is dissolved into bubbles 20 and thus a mixed gas of nitrogen and HMDS is produced. By continuting this bubbling for an operating time set by timer 33, the gas pressure and concentration in tank 13 are allowed to rise and are set at specified values.

Gas supply valve 18 is closed by controller 27 to stop the supply of nitrogen gas and the bubbling as a preliminary processing is finished.

Then, change-over valve 24 is connected to processing section 30 by means of controller 27 and processing of wafer 28 is automatically resumed.

As described above, refilling tank 13 with a liquid, preliminary processing and adhesion promotion can be done automatically without the help of an operator, making it unnecessary for the operator to work in the clean room.

This removes the possibilities that the operator is endangered by harmful gases or the operator brings dust into the clean room. In addition, the downtime of manufacturing equipment is reduced. Therefore, desired processing can be done with eminently high efficiency.

This invention is not limited to the above embodiment, but various changes and modifications may be made in the invention without departing from the spirit and scope thereof. In the above embodiment, description has been made of a case in which the main parts of the processing liquid supply unit are mounted in the main body of the processing apparatus. However, it is possible to install the processing apparatus and the processing liquid supply device separately. The processing liquid unit may be installed outside the clean room. In this case, since the piping has to be long from the processing liquid tank to the processing section, there is a possibility of the processing liquid deteriorating. Hence, it is desirable to install the processing liquid supply device as close to the processing section as possible in the clean room as in the above-described embodiment.

More than one processing liquid tank may be provided in the main body of the device. For example, as shown in FIG. 2, two tanks 41 and 42 are provided and nitrogen gas is supplied to each tank through pipes 45, 50 and 51 and the processing liquid is supplied through pipes 46, 49 and 52. In this case, there are provided change-over valve 47 for switching over the passage of nitrogen gas between pipes 50 and 51 and change-over valve 48 for switching over the passage of the processing liquid between pipes 49 and 52. The mixed gas produced in each tank is passed through pipes 53 and 55 and led through 56 into the processing section. In addition, change-over valve 54 is provided for connecting either pipe 53 or pipe 55 to pipe 56. By installing a plurality of tanks as described, the efficiency of processing with a processing liquid can be further improved.

A reserve tank is used as a means for refilling the liquid into the tank in the main body of the device in the above embodiment, but it is possible to arrange a liquid supply system such that the processing liquid is supplied directly from the liquid supply source in a factory.

In the above embodiment, the processing liquid is transported from the reserve tank by gas pressure feed, but some other means may be used in which pipe 61 is dipped in the processing liquid of reserve tank 15 and the liquid is pumped up by pump 62 to supply it as shown in FIG. 3.

The processing liquid used in the above embodiment is HMDS but the liquid is not limited to HMDS. Various processing liquids, such as developer, a thinner a resist solution and an etching agent, may be used in place of HMDS. These processing liquids are used respectively for a pattern developing process for semiconductor wafers, a wafer cleaning process, a resist film forming process and resist etching process for wafers. The processing section used in this case is of a type adapted for such a specific processing.

The means for supplying the processing liquid to the processing section is not limited to those which have been described above, but other various means such as pump feed and gas pressure feed may be used. In the case of pump feed, as shown in FIG. 4, pipe 63 is dipped in the processing liquid in tank 13, and the processing liquid is pumped up by pump 64 and supplied to the processing section. When gas pressure feed is adopted, a gas is supplied through pipe 65 into tank 13 and the gas pressure is used to cause the processing liquid to be passed through pipe 66 to supply the liquid to the processing section. When a developer is used as a processing liquid, gas pressure feed should preferably be employed. For the supply of a thinner, pump feed should preferably be used and for the supply of a photoresist, pump feed by a bellows pump should preferably be employed.

Instead of nitrogen gas, argon gas may be used as the carrier gas for HMDS and for the purpose of delivering a processing liquid from the reserve tank.

Instead of the static capacity type sensors, other types of sensors, such as float sensors and infrared sensors may be used.

The objects to be processed in the above embodiment are semiconductor wafers, but this invention may be applied to other articles such as LCD substrates.

What is claimed is:

1. A processing liquid supply unit for supplying a processing liquid to an object to be processed in a clean room, said unit comprising:

a reserve tank, for reserving a processing liquid, located outside of said clean room;

a storing tank for storing said processing liquid supplied from said reserve tank;

detecting means for detecting the amount of the processing liquid stored in said storing tank;

refilling means for automatically refilling the processing liquid into said storing tank on the basis of detection signals from said detecting means;

processing liquid delivery means for delivering the processing liquid from said storing tank to an object to be processed; and means for forming a resist film on said object, wherein said processing liquid is for forming said resist film on said object.

2. A processing liquid supply unit according to claim 1, wherein said processing liquid includes a resist solution.

3. A processing liquid supply unit according to claim 1, wherein said processing liquid includes a developer.

4. A processing liquid supply unit according to claim 1, wherein said refilling means comprises piping means for connecting said reserve tank with said storing tank, supplying means for supplying said processing liquid to said storing tank through said piping means under a pressure generated by introducing said carrier gas into said reserve tank, and exhaust means for exhausting said processing liquid and said carrier gas from said storing tank.

5. A processing liquid supply unit according to claim 1, wherein said processing liquid delivery means includes pressure feed gas supply means for supplying a pressure feed gas to pressure-feed a processing liquid to add to the processing liquid stored in said storing means.

6. A processing liquid supply unit according to claim 1, wherein said processing liquid delivery means includes a pump for delivery of the processing liquid stored in said storing means.

7. A processing liquid supply unit according to claim 1, further comprising control means for controlling the refilling of processing liquid by said refilling means on the basis of detection by said detecting means.

8. A processing liquid supply unit according to claim 1, wherein said detecting means includes a sensor to detect the level of the processing liquid in said processing liquid storage tank.

9. A processing liquid supply unit according to claim 1, wherein said processing liquid includes HMDS.

10. A processing liquid supply unit according to claim 1, wherein said processing liquid delivery means includes carrier gas supply means for supplying a carrier gas into said processing liquid in said storing tank and dissolving said processing liquid in said carrier gas into vapor form, piping means for carrying the vapor of said processing liquid from said storing tank to said object, and valve means for allowing the vapor of said processing liquid to be delivered to said object, and for stopping the supply of the carrier gas, when the gas pressure and concentration in said storing tank rise to specified values.

11. A processing liquid supply unit according to claim 10, further comprising controlling means for controlling said valve means, to allow the vapor of said processing liquid to be delivered to the object, when the gas pressure and concentration in said storing tank rise to said specified values.

12. A processing liquid supply unit for supplying a processing liquid to an object to be processed, said unit comprising:

storing means for storing a processing liquid;
 detecting means for detecting the amount of the processing liquid stored in said storing means;
 refilling means for automatically refilling the processing liquid into said storing means on the basis of detection signals from said detection means;
 processing liquid delivery means for delivering the processing liquid from said storing means to an object to be processed; and
 means for forming a resist film on said object, wherein said processing liquid is for forming said resist film on said object,
 said storing means having two storing tanks connected in parallel,
 said processing liquid delivery means including carrier gas supply means for supplying a carrier gas into said processing liquid in one of said storing tanks and dissolving said processing liquid in said carrier gas into vapor form, piping means for carrying the vapor of said processing liquid from said storing tanks to said object, and valve means for allowing the vapor of said processing liquid to be delivered to said object, and for stopping the supply of the carrier gas when the gas pressure and concentration in said one of said storing tanks rise to specified values, wherein;
 while the vapor is supplied to said object from one of said storing tanks, the other of said storing tanks is supplied with processing liquid by said refilling means, and while the vapor is supplied to said object from the other of said storing tanks, said one of said storing tanks is supplied with processing liquid by said refilling means; and
 while said carrier gas is supplied to said one of said storing tanks, said vapor of said processing liquid is supplied to said object from the other one of said storing tanks.

* * * * *